United States Patent [19]
Ohmi

[11] Patent Number: 5,954,885
[45] Date of Patent: Sep. 21, 1999

[54] CLEANING METHOD

[76] Inventor: Tadahiro Ohmi, 1-17-301, Komegabukuro 2-chome, Aoba, Sendai, Miyagi-ken, 980, Japan

[21] Appl. No.: 08/860,507
[22] PCT Filed: Dec. 27, 1995
[86] PCT No.: PCT/JP95/02731
§ 371 Date: Jul. 25, 1997
§ 102(e) Date: Jul. 25, 1997
[87] PCT Pub. No.: WO96/21242
PCT Pub. Date: Jul. 11, 1996

[30] Foreign Application Priority Data
Jan. 6, 1995 [JP] Japan .............................. 7/905
[51] Int. Cl.$^6$ .............................. B08B 6/00; B08B 3/00
[52] U.S. Cl. .............................. 134/1.3; 134/1; 134/1.3; 134/26
[58] Field of Search .................... 134/1, 1.3, 26

[56] References Cited

U.S. PATENT DOCUMENTS

| | | | |
|---|---|---|---|
| 3,893,869 | 7/1975 | Mayer et al. | 134/86 |
| 5,090,432 | 2/1992 | Bran | 134/139 |
| 5,100,476 | 3/1992 | Mase et al. | 134/1 |
| 5,328,555 | 7/1994 | Gupta | 156/643 |
| 5,339,842 | 8/1994 | Bok | 134/1 |
| 5,464,480 | 11/1995 | Matthews | 134/1.3 |
| 5,472,516 | 12/1995 | Hanson et al. | 134/18 |
| 5,476,816 | 12/1995 | Mautz et al. | 437/195 |
| 5,601,655 | 2/1997 | Bok et al. | 134/1 |
| 5,625,249 | 4/1997 | Grant | 310/334 |
| 5,656,097 | 8/1997 | Olesen et al. | 134/1 |
| 5,698,040 | 12/1997 | Guldi et al. | 134/1.3 |

FOREIGN PATENT DOCUMENTS

| | | |
|---|---|---|
| 61-292325 | 12/1986 | Japan . |
| 62-277734 | 12/1987 | Japan .............................. H01L 21/304 |
| 2-152232 | 6/1990 | Japan .............................. H01L 21/304 |
| 2-96726 | 8/1990 | Japan . |
| 3-14230 | 1/1991 | Japan .............................. H01L 21/304 |
| 3-41729 | 2/1991 | Japan .............................. H01L 21/304 |
| 3-129732 | 6/1991 | Japan .............................. H01L 21/304 |
| 3-136329 | 6/1991 | Japan .............................. H01L 21/304 |
| 4-207030 | 7/1992 | Japan .............................. H01L 21/304 |
| 4-354334 | 12/1992 | Japan .............................. H01L 21/304 |
| 5-102115 | 4/1993 | Japan .............................. H01L 21/304 |
| 5-259144 | 10/1993 | Japan .............................. H01L 21/304 |
| 6-314679 | 11/1994 | Japan . |

OTHER PUBLICATIONS

Kern, Handbook of Semiconductor Wafer Cleaning Technology, 1993, pp. 24, 84, 85, 122, 141, 144, 145, 393, 400–402.

Primary Examiner—Jill Warden
Assistant Examiner—Yolanda E. Wilkins
Attorney, Agent, or Firm—Randall J. Knuth

[57] ABSTRACT

A cleaning method which reduces the quantity of use of a chemical solution and ultrapure water by simplifying the cleaning process, has an extremely high cleaning effect, and does not damage a semiconductor substrate. This cleaning method comprises a first step of removing organic matters, metals, and fine particles adhering to a substrate body by ultrapure water containing ozone, a second step of applying megasonic to a solution of a mixture of ultrapure water and hydrofluoric acid in a cleaning bath to remove the metals and the fine particles adhering to the substrate body, a third step of removing the chemical solution used in the second step, and a forth step of applying megasonic to the ultrapure water in the cleaning bath to clean the substrate body.

10 Claims, 1 Drawing Sheet

CLEANING METHOD

TECHNOLOGICAL FIELD

The present invention relates to a cleaning method, and more specifically to a method of cleaning a semiconductor substrate.

BACKGROUND TECHNOLOGY

A process of cleaning a semiconductor substrate is one of the most important processes in a semiconductor device production process, and its importance has been increasingly higher as performance and a degree of integration in semiconductor device have also been becoming higher.

Conventionally, sulfuric acid, chloric acid, ammonia, hydrogen peroxide, hydrofruolic acid, or a mixture thereof have been used for removing impurities adhering to a surface of a semiconductor substrate. But it has been found as a result of a research conducted by the present inventors that the impurities can not completely be removed with these chemicals, and also that a surface of a semiconductor is corroded by these chemicals and minute irregularities are generated on the surface, and it has been confirmed that these phenomena give effects to device characteristics such as mobility of carrier and insulating performance of an oxide film formed on the surface. Accordingly, it has been desired to develop a cleaning method enabling complete removal of impurities without giving any damage to the semiconductor substrate for production of semiconductor devices with higher performance.

In addition, as the cleaning method based on the conventional technology required a long time and the cleaning steps are very complicated, and also as a vast quantity of chemicals or ultra-pure water is used, the cost is very large, and large scale facilities are required, so that price reduction of semiconductor devices has been prevented.

To solve the problems as described above, it is an object of the present invention to provide a cleaning method with extremely excellent cleaning effect which enables reduction in a quantity of chemicals and ultra-pure water used for cleaning and also which give no damage to a semiconductor substrate.

DISCLOSURE OF THE INVENTION

The cleaning method according to the present invention comprises a first step of removing organic materials, metal, particles adhering to a substrate with ultra-pure water containing ozone; a second step of removing metal or particles adhering to the substrate by irradiating megasonic to a chemical comprising ultra-pure water containing hydrofluoric acid in a cleaning bath; a third step of removing the chemical used in the second step, and a fourth step of cleaning the substrate by irradiating megasonic to the ultra-pure water in the cleaning bath.

Gasses result therein should preferably be removed from the ultra-pure water used in the second step and/or the fourth step.

All the first to fourth steps are performed under a room temperature. Further, the third step is characterized in that the chemical is removed by showering or spraying ultra-pure water.

The present invention is advantageously applied to a case where the ultra-pure water used in the second step contains hydrofluoric acid, hydrogen peroxide, or a surfactant.

It is preferable that the second and/or the fourth step are based on a system in which ultra-pure water in a cleaning bath withdrawn keeping a flow of the ultra-pure water therein at a constant speed and that megasonic is irradiated from a top of the cleaning bath. Especially, a frequency of the megasonic should preferably be in a range from 0.8 to 10 MHz.

It is desirable that the first to fourth steps described above are carried out in an inactive atmosphere with the purity of 99.9999 or more, and also it is desirable that concentration of ozone in the ultra-pure water containing ozone therein is in a range from 2 to 10 ppm.

Function

With the present invention, impurities adhering to a semiconductor substrate such as organic materials, metal, or particles can be removed. Further when cleaning is performed according to the present invention, minute irregularities are not generated on the surface at all. The reason is presumably as described below.

At first, by using ultra-pure water with ozone added therein in the first step, organic materials adhering to a surface of a semiconductor are completely oxidized and decomposed and at the same time the semiconductor surface is mildly oxidized, so that also a portion of metal or particles is fetched into the oxide film. In the second step, the oxide film is removed by hydrofluoric acid, and at the same time impurities such as metal fetched into the oxide film are removed. The removal of impurities is enhanced when megasonic irradiation is applied to the hydrofluoric acid, whereby the hydrofluoric acid vibrates while contacting the semiconductor surface, so that removal of particles is executed speedily. It is also conceivable that hydrogen bond in water is disconnected causing changes in the physical properties such as viscosity and removal of impurities is promoted further. In this step, it is possible to remove an oxide film with hydrofluoric acid by adding, in addition to hydrofluoric acid, hydrogen peroxide and a surfactant to oxide the surface with the hydrogen peroxide, and for this reason, even if a quantity of impurities, removal of impurities can easily be executed.

In the third step, hydrofluoric acid or surfactant used in the second step and remaining on a substrate is rinsed with ultra-pure water to clean it away. This rinsing should preferably be executed with a shower or a spray so that ultra-pure water always contact a surface of a semiconductor. In the fourth step, which is a final step, megasonic is irradiated onto ultra-pure water to completely clean off a minute quantity of the chemical or chemicals not removed away by means of showering or spraying. As described above, it is conceivable that, due to vibration of ultra-pure water, physical properties of water are further changed, and mutual reaction between remaining components of a chemical and water is further promoted, and the semiconductor surface is completely cleaned.

It should be noted that, if megasonic irradiation is executed in the second step or in the third step and a dissolved gasses is present therein, the dissolved gasses may be changed to ordinary gasses causing non-uniformity in cleaning, and for this reason it is desirable that the deaeration should be executed previously to remove the dissolved gasses. A deaerating apparatus with UF (ultrafiltration film) may be used for deaeration for removing dissolved gasses. In this case, even if a minute quantity of particles or other foreign materials is present in the ultra-pure water, the foreign materials can be removed simultaneously with the UF film.

Further, it is preferable to match a direction in which the ultra-sonic proceeds to a direction in which the ultra-pure water flows, and for this reason, it is desirable to irradiate megasonic from the upper side by keeping a uniform flow of ultra-pure water and withdrawing the ultra-pure water downward (from the upper side to the lower side). With this operation, the cleaning effect is further improved. Further, a frequency of the megasonic should preferably be in a range from 0.8 MHz to 10 MHz. By setting the frequency to this range, the cleaning effect is further improved.

It is preferable to execute the cleaning steps according to the present invention in an inactive gas atmosphere free of impurities. This is for evading intrusion of impurities from the atmosphere and also for preventing generation of a oxide film after the oxide film is removed in the second step. As an inactive gas, for instance, a $N_2$ gas or an Ar gas may be used, and a concentration of impurities in the inactive gas should preferably be 1 ppb or less.

A concentration of ozone in ultra-pure water with ozone added therein, which is used in the first step, should preferably be in a range from 2 to 10 ppm. If the concentration is 2 ppm or less, oxidization of organic materials may be inadequate, while, if the concentration is 10 ppm or more, a thickness of the oxide film is too large, which in turn requires a long period of time for removal thereof and results in increase of a surface roughness. Further, the ultra-pure water may be withdrawn downward like in the fourth step to realize a uniform flow of the ultra-pure water. Further, the megasonic may be irradiated from the upper side. In the first step, different from other steps, dissolved ozone is precipitated even if megasonic is irradiated, but as an oxide film is generated on the surface, and bubbles never reside on the surface.

BEST MODE FOR CARRYING OUT THE INVENTION

Figure 1:
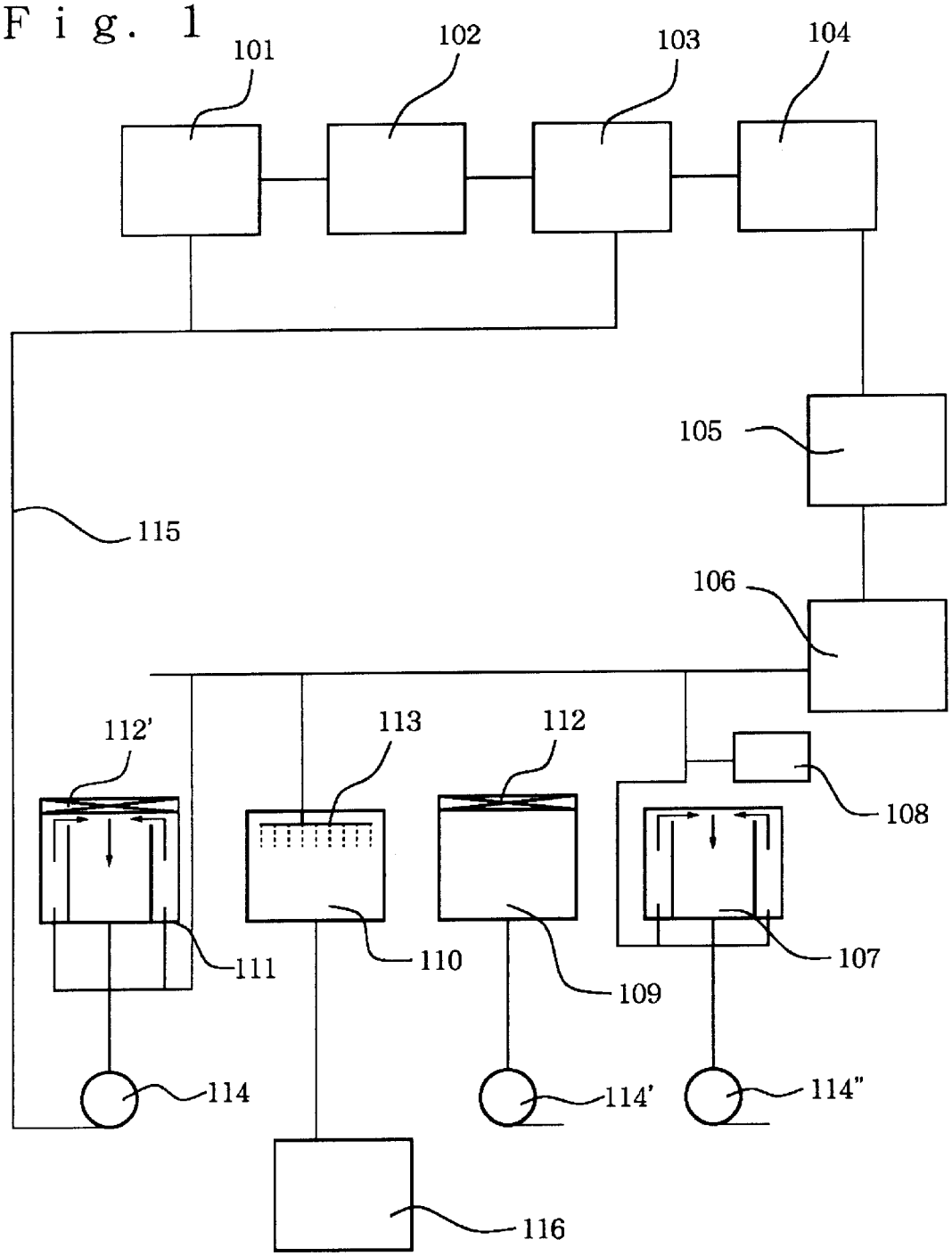
FIG. 1 is a concept drawing showing a cleaning line according to Embodiment 1 of the present invention.
(Description of Signs)
101: Feed water tank
102: Pre-processing device
103: Primary pure water tank
104: Reverse osmosis module and ion-exchange column
105: Ultra-pure water tank
106: UF deaerating device
107: Cleaning bath for first step
108: Ozone generator
109: Cleaning bath for second step
110: Cleaning bath for third step
111: Cleaning bath for fourth step
112, 112': Oscillator for generation of megasonic1
13: Shower
114, 114', 114", : Pump
115: Recovery line
116: Tank for hydrofluoric acid processing

Next description is made for the present invention with reference to embodiments thereof.

EMBODIMENT 1 AND COMPARATIVE EXAMPLE 1

(Embodiment 1)

A cleaning line in which cleaning according to the present invention is applied is shown in FIG. 1.

In FIG. 1, designated at the reference numeral 1 is a feed water tank, at 102 a pre-processing device, at 103 a primary water tank, at 104 a reverse osmosis module and an ion-exchange column, at 105 a ultra-pure water tank, at 106 a UF deaerating device, at 107 a cleaning bath for the first step, at 108 an ozone generator, at 109 a cleaning bath for the second step, and at 110 a cleaning bath for the third step, which is a shower cleaning bath. The cleaning liquid is sent to a tank for processing 116 with hydrofluoric acid, and hydrofluoric acid is reacted too calcium carbonate and is recovered as calcium fluoride. The reference numeral indicates a cleaning bath for the fourth step, and the cleaning liquid is circulated via a pump 114 and a recovery line 115 to a primary ultra-pure water or to the feed raw tank 101. In a case of this cleaning line, around 80 percent of ultra-pure water used can be recovered under the following conditions. The reference numerals 112, 112' indicate an oscillator for generating megasonic.

Using the cleaning line shown in FIG. 1, 25 sheets of 5-inch wafer are accommodated in a wafer carrier made of Teflon, and are successively carried to the cleaning baths in the first to fourth steps, when the wafers are subjected to processing for cleaning with respective cleaning liquids.

It should be noted that a quantity of a chemical in the cleaning bath for the third step is 7 l. Further, the cleaning conditions are as flows:

First step: The sample is dipped in 5 l ultra-pure water with ozone added therein (ozone concentration of 10 ppm) for 3 minutes and then cleaned.

Second step: The sample is dipped and cleaned in a mixture of hydrofluoric acid, hydrogen peroxide, and ultra-pure water with also a surfactant (200 ppm) added therein (0.03:1:2) for 10 minutes irradiating a ultra-sonic(1 MHz, 1200 W).

Third step: Cleaning is executed for 10 minutes with a ultra-pure water shower having a low rate of 1.5 l/min.

Fourth step: Cleaning is executed for 10 minutes irradiating ultra-sonic (1 MHz, 1200 W) to ultra-pure water flowing at a flow rate of 1.5 l/min.

The ultra-pure water in the fourth step is ultra-pure water with dissolved gasses having been removed therefrom, using a UF deaerating device. Further, the oscillator for generation of megasonic was placed on a top of the cleaning bath, and the ultra-pure water was withdrawn from the bottom of the cleaning bath. Further, in the fourth step, ultra-pure water was withdrawn from the bottom of the cleaning bath.

After each sample was cleaned according to the cleaning method according to the present invention, quantities of organic materials, metal, and particles were measured with FTIR (made by Vio-Rad), TRXRF (made by Technos), and WIS150 (made by Canon) respectively. The result is shown in Table 1.

Further, a quantity of ultra-pure water used for cleaning and a quantity of chemicals are shown in Table 2.

COMPARATIVE EXAMPLE 1

Quantities of organic materials, metal, and particles adhering to a wafer surface after cleaned according to the conventional cleaning method were measured for comparison like in Embodiment 1. A result of measurement and a quantity of ultra-pure water used for cleaning and a quantity of each chemical are shown in Table 1 and Table 2 respectively.

The cleaning conditions in the comparative example are as shown below.

| | |
|---|---|
| 1: Sulfuric acid + hydrogen peroxide (4:1) | 5 minutes |
| 2: Rinsing with ultra-pure water (1.5 l/min) | 5 minutes |
| 3: Sulfuric acid + hydrogen peroxide (4:1) | 5 minutes |
| 4: Rinsing with ultra-pure water (1.5 l/min) | 5 minutes |

-continued

| | | |
|---|---|---|
| 5: Sulfuric acid + hydrogen peroxide (4:1) | 5 minutes |
| 6: Rinsing with ultra-pure water (1.5 1/min) | 10 minutes |
| 7: Hydrofluoric acid + ultra-pure water + hydrogen peroxide (0.03:1:2) | 1 minute |
| 8: Rinsing with ultra-pure water (1.5 1/min) | 10 minutes |
| 9: Sulfuric acid + hydrogen peroxide (4:1) | 5 minutes |
| 10: Rinsing with ultra-pure water (1.5 1/min) | 10 minutes |
| 11: Hydrofluoric acid + ultra-pure water + hydrogen peroxide (0.03:1:2) | 1 minute |
| 12: Rinsing with ultra-pure water (1.5 1/minute) | 10 minutes |
| 13: Ammonia + hydrogen peroxide + ultra-pure water (0.05:1:5) | 10 minutes |
| 14: Rinsing with ultra-pure water (1.5 1/min) | 10 minutes |
| 15: Hot ultra-pure water (1.5 1/min) | 10 minutes |
| 16: Rinsing with ultra-pure water (1.5 1/minute) | 10 minutes |
| 17: Hydrofluoric acid + ultra-pure water + hydrogen peroxide (0.03; 1:2) | 1 minute |
| 18: Rinsing with ultra-pure water (1.5 1/min) | 10 minutes |
| 19: Chloric acid + hydrogen peroxide + ultra-pure water (1:1:6) | 10 minutes |
| 20: Hot ultra-pure water (1.5 1/min) | 10 minutes |
| 21: Rinsing with ultra-pure water (1.5 1/min) | 10 minutes |
| 22: Hydrofluoric acid + ultra-pure water + hydrogen peroxide (0.03:1:2) | 1 minute |
| 23: Rinsing with ultra-pure water (1.5 1/min) | 10 minutes |

TABLE 1

| | Quantity of Residual Impurities after Cleaning | | |
|---|---|---|---|
| | Quantity of organic materials ($CH_2$) (mol/cm$^2$) | Quantity of metal (Cu) (atom/cm$^2$) | Quantity of particles (>0.1 μm) |
| Comparative example 1 | $3.3 \times 10^{14}$ | $5 \times 10^{10}$ | 9 |
| Embodiment 1 | 0* | $5 \times 10^8$ | 0 ~ 1 |

*Below limit for detection

TABLE 2

| | Ultra-pure water | Chemical |
|---|---|---|
| Comparative example 1 | 180 L | 70 L |
| Embodiment 1 | 34.5 L | 7 L |

As clearly understood from Table 1, it has been found that the cleaning method according to this embodiment is effective in cleaning any types of impurities including organic materials, metal, and particles. Further, as shown in Table 2, a quantity of the ultra-pure water and a quantity of chemicals use in the present embodiment are ⅕ or less as compared to those in the conventional technology, which in turn result in substantial reduction of cleaning cost, and also that a period of time required for cleaning is also reduced.

Embodiment 2

Cleaning was executed under the same conditions as those in Embodiment 1 excluding the fact that frequencies of the megasonic 112, 112' were changed, and impurities on a wafer surface were measured. A result of the measurement is shown in Table 3.

TABLE 3

| | Quantity of Residual Impurities after Cleaning | | |
|---|---|---|---|
| frequency | Quantity of organic materials ($CH_2$) (mol/cm$^2$) | Quantity of metal (Cu) (atom/cm$^2$) | Quantity of particles (>0.1 μm) |
| 0.7 MHZ | $1.5 \times 10^{14}$ | $6 \times 10^9$ | 4 ~ 5 |
| 0.8 MHz | 0 | $1.7 \times 10^8$ | 1 ~ 2 |
| 1 MHz | 0 | $1 \times 10^8$ | 0 ~ 1 |
| 10 MHz | 0 | $1.2 \times 10^8$ | 0 ~ 1 |
| 12 MHZ | $3 \times 10^{13}$ | $1.5 \times 10^8$ | 1 ~ 2 |

As clearly understood from Table 3, it has been found that frequencies of the megasonic in a range from 0.8 to 10 MHz shows the excellent cleaning effect.

Embodiment 3

As a cleaning liquid used in the second step in Embodiment 1, hydrofluoric acid diluted with ultra-pure water to 5% and with dissolved gasses removed with a UF deaerating device was used, 1 MHz megasonic was irradiated from a top of the cleaning bath, and cleaning was performed withdrawing the ultra-pure water from the bottom of the cleaning bath at a flow rate of 1.5 l/min. Operations were executed like in Embodiment 1 excluding the second step.

Impurities on the wafer surface after cleaning were measured like in Embodiment 1, and any of organic materials, metal, and particles was not detected, and it was found that the cleaning method according to the present invention further improves the cleaning effect.

Industrial Applicabilities

The present invention can provide a cleaning method which enable complete removal of impurities adhering to a surface of a semiconductor such as organic materials, metal, an particles without giving damages to the semiconductor substrate. Further, the processing sequence is quite simple, so that the processing can be completed within a short period of time, and further the stable cleaning effect can be obtained. Furthermore, quantities of ultra-pure water and chemicals are largely reduced, so that low-price semiconductors can be realized.

In addition, a number of required cleaning baths can be reduced as compared to the conventional technology, so that an area of the wet line itself can be reduced to around 1.3 of that in the conventional technology.

I claim:

1. A cleaning method comprising:

a first step of removing organic materials, metal and particles adhering to a substrate body with ultra-pure water containing ozone in a cleaning bath;

a second step of removing metal and particles adhering to the substrate by irradiating megasonic to a chemical comprising ultra-pure water containing hydrofluoric acid in a cleaning bath;

a third step of removing the chemical used in said second step; and a fourth step of cleaning the substrate by irradiating megasonic to ultra-pure water in a cleaning bath.

2. The cleaning method according to claim 1 wherein the ultra-pure water used in at least one of the second step and the fourth step is that from which dissolved gases have been removed.

3. The cleaning method according to claim 1 wherein any of the steps is executed at room temperature.

4. The cleaning method according to claim 1 wherein the chemical in said third step is removed from the substrate body by a spray of ultra-pure water.

5. The cleaning method according to claim 1 wherein the ultra-pure water used in said second step contains hydrogen peroxide and a surfactant.

6. The cleaning method according to claim 1 wherein the ultra-pure water in one of said second step and fourth step is flowed at a constant speed and withdrawn downward over the substrate body while megasonic is irradiated from a top portion of the cleaning bath.

7. The cleaning method according to claim 1 wherein a frequency of the megasonic is in the range of approximately 0.8 to 10 Megahertz.

8. The cleaning method according to claim 1 wherein any of the steps are carried out in an inactive atmosphere with the purity of 99.9999% or more.

9. The cleaning method according to claim 1 wherein the concentration of ozone in said ultra-pure water containing ozone therein in a range of approximately 2 to 10 ppm.

10. The cleaning method according to claim 1 wherein the flow of ultra-pure water containing ozone in the cleaning bath of the first step is kept at constant flow speed, withdrawn downward over the substrate and irradiated with megasonic from a top portion of the cleaning bath.

* * * * *

UNITED STATES PATENT AND TRADEMARK OFFICE
CERTIFICATE OF CORRECTION

PATENT NO. : 5,954,885

DATED : September 21, 2000

INVENTOR(S) : Tadahiro Ohmi

It is certified that error appears in the above-identified patent and that said Letters Patent is hereby corrected as shown below:

**On the Title Page, Item [76], "Sendai" should read ----- Sendai-shi -----.
Column 1, line 16, "hydrofruolic" should read ---- hydrofluoric -----.
Column 1, line 55, "Gasses" should read ---- Gases ----.**

Signed and Sealed this

Twenty-ninth Day of May, 2001

Attest:

NICHOLAS P. GODICI

Attesting Officer

Acting Director of the United States Patent and Trademark Office